United States Patent
West et al.

(10) Patent No.: US 11,072,852 B2
(45) Date of Patent: Jul. 27, 2021

(54) PRE-CONDITIONED CHAMBER COMPONENTS

(71) Applicant: Applied Materials, Inc., Santa Clara, CA (US)

(72) Inventors: Brian T. West, San Jose, CA (US); Lizhong Sun, San Jose, CA (US); William M. Lu, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 30 days.

(21) Appl. No.: 16/456,769

(22) Filed: Jun. 28, 2019

(65) Prior Publication Data

US 2020/0024725 A1 Jan. 23, 2020

Related U.S. Application Data

(60) Provisional application No. 62/702,327, filed on Jul. 23, 2018.

(51) Int. Cl.
| | |
|---|---|
| *H01J 37/34* | (2006.01) |
| *C23C 14/35* | (2006.01) |
| *C23C 14/50* | (2006.01) |
| *C23C 14/04* | (2006.01) |
| *H01J 37/20* | (2006.01) |
| *H01J 37/32* | (2006.01) |
| *C23C 14/34* | (2006.01) |

(52) U.S. Cl.
CPC ............ *C23C 14/35* (2013.01); *C23C 14/046* (2013.01); *C23C 14/345* (2013.01);
(Continued)

(58) Field of Classification Search
CPC . C23C 14/046; C23C 14/3407; C23C 14/345; C23C 14/35; C23C 14/50;
(Continued)

(56) References Cited

U.S. PATENT DOCUMENTS 3,514,391 A * 5/1970 Hablanian ............. C23C 14/355
204/298.06
5,744,016 A * 4/1998 Yamada ............... C23C 14/0068
204/192.12

(Continued)

FOREIGN PATENT DOCUMENTS

| JP | 2012518267 A | 8/2012 |
| TW | 201734237 A | 10/2017 |

OTHER PUBLICATIONS

International Search Report and Written Opinion for Application No. PCT/US2019/039332 dated Oct. 18, 2019.
(Continued)

*Primary Examiner* — Rodney G McDonald
(74) *Attorney, Agent, or Firm* — Patterson + Sheridan LLP

(57) ABSTRACT

Embodiments of the disclosure generally relate to a process kit including a shield serving as an anode in a physical deposition chamber. The shield has a cylindrical band, the cylindrical band having a top and a bottom, the cylindrical band sized to encircle a sputtering surface of a sputtering target disposed adjacent the top and a substrate support disposed at the bottom, the cylindrical band having an interior surface. A texture is disposed on the interior surface. The texture has a plurality of features. A film is provided on a portion of the features. The film includes a porosity of about 2% to about 3.5%.

20 Claims, 4 Drawing Sheets

(52) U.S. Cl.
CPC .......... *C23C 14/3407* (2013.01); *C23C 14/50* (2013.01); *H01J 37/20* (2013.01); *H01J 37/32082* (2013.01); *H01J 37/32431* (2013.01); *H01J 37/3405* (2013.01)

(58) Field of Classification Search
CPC ... C23C 14/564; H01J 37/20; H01J 37/32082; H01J 37/32431; H01J 37/3405; H01J 37/32651; H01J 37/3447; H01J 37/3441
USPC .................................................. 204/298.11
See application file for complete search history.

(56) References Cited

U.S. PATENT DOCUMENTS

| | | | |
|---|---|---|---|
| 5,837,057 A | * | 11/1998 | Koyama ................ B41J 2/1642 118/723 VE |
| 8,206,829 B2 | | 6/2012 | Sun et al. |
| 2002/0090464 A1 | * | 7/2002 | Jiang ..................... C23C 14/564 427/446 |
| 2004/0035698 A1 | | 2/2004 | Ivanov et al. |
| 2005/0084654 A1 | * | 4/2005 | Takahashi ................ C23C 4/06 428/143 |
| 2005/0271984 A1 | | 12/2005 | Brueckner et al. |
| 2008/0092806 A1 | | 4/2008 | West et al. |
| 2011/0207332 A1 | | 8/2011 | Liu et al. |
| 2016/0349621 A1 | | 12/2016 | Huang et al. |
| 2017/0145553 A1 | | 5/2017 | Liu et al. |
| 2017/0316924 A1 | * | 11/2017 | Cox .................. H01L 21/02266 |

OTHER PUBLICATIONS

Taiwan Office Action in related application TW 108125621 dated Jan. 14, 2021.

* cited by examiner

US 11,072,852 B2

PRE-CONDITIONED CHAMBER COMPONENTS

CROSS-REFERENCE TO RELATED APPLICATION

This application claims benefit of U.S. Provisional Patent Application Ser. No. 62/702,327, filed Jul. 23, 2018, which is hereby incorporated herein by reference.

BACKGROUND

Field

Embodiments of the disclosure apply to the deposition of films in any chamber utilizing a plasma enhanced process. More specifically embodiments of the disclosure relate to a processing kit suitable for maintaining ground potential of an anode in a physical deposition chamber.

Description of the Related Art

Physical vapor deposition (PVD), or sputtering, is one of the most commonly used processes in the fabrication of electronic devices. PVD is a plasma process performed in a vacuum chamber where a negatively biased target is exposed to a plasma, i.e., charged particles, of an inert gas having relatively heavy atoms (e.g., argon (Ar)) or a gas mixture comprising such inert gas. There may additionally be a reactive gas used as well, such as oxygen, nitrogen, etc. that combines with the target material. The plasma is maintained in the chamber by supplying energy (e.g., RF, magnetic, electric, electromagnetic) to the gas mixture. Bombardment of the target by ions of the inert gas results in ejection of atoms of the target material. The ejected atoms accumulate as a deposited film on a substrate placed on a substrate support pedestal disposed within the chamber.

The process kit may act as the anode for the charged particles of the plasma. When dielectric films are deposited in PVD chambers, a dielectric layer formed from the target material is deposited on the process kit as well as the substrate. The dielectric layer deposited on the process kit changes the properties of the plasma which causes a process drift for a period of time until a steady-state (i.e., a stable plasma) is achieved. However, reaching the steady-state takes a considerable amount of chamber time as well as consuming valuable target material that coats the process kit.

Therefore, there is a need for improving the performance of the anode in a sputtering chamber.

SUMMARY

Embodiments of the disclosure generally relate to a process kit including a shield serving as an anode in a physical deposition chamber. The shield has a cylindrical band, the cylindrical band having a top and a bottom, the cylindrical band sized to encircle a sputtering surface of a sputtering target disposed adjacent the top and a substrate support disposed at the bottom, the cylindrical band having an interior surface. A texture is disposed on the interior surface. The texture has a plurality of features. A film is provided on a portion of the features. The film includes a porosity of about 2% to about 3.5%. A shaded area is disposed in the feature wherein the shaded area is not visible to the sputtering target. An anode surface is disposed in the shaded area.

In another embodiment, process kit for a radio frequency physical vapor deposition (RFPVD) chamber is provided that includes a conductive body. The body has an orientation when the process kit is in use in the RFPVD chamber that defines a top of the body and a vertical centerline. The body has an array of features formed in a substantially vertical surface of the body that is exposed to a plasma when the process kit in use in the RFPVD chamber. The features have a profile and an opening in the surface. A greater portion of the profile resides above an imaginary line extending perpendicularly through the vertical centerline and an edge of the opening closest the top of the body. A film is formed on a portion of the features. The film includes a porosity of about 2% to about 3.5%.

In yet another embodiment, a physical vapor deposition (PVD) chamber is provided. The PVD chamber includes a chamber body defining in interior volume, a substrate support disposed in the interior volume, a sputtering target disposed in the interior volume above the substrate support, and a process kit disposed in the interior volume between the substrate support and sputtering target. The process kit includes conductive body having a vertical centerline. The body has an array of features formed in a surface of the body that is exposed to a plasma when in use in the PVD chamber. The features have a profile and an opening in the surface. The profile has a geometric centerline extending away from the target through the opening. The geometric centerline forms an obtuse angle with the vertical centerline of the body. A film is formed on a portion of the features. The film includes a porosity of about 2% to about 3.5%.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
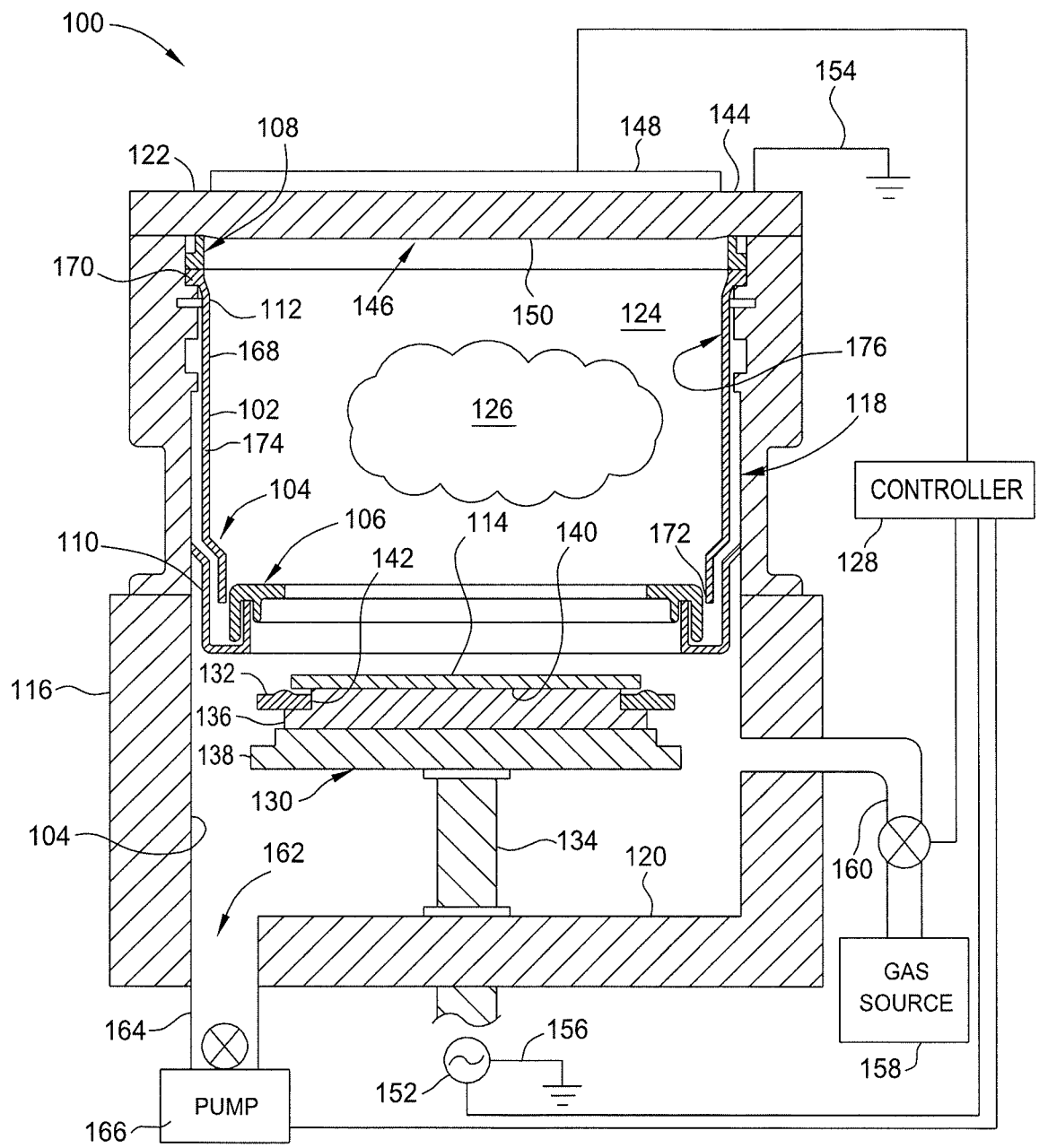
FIG. 1 is a simplified sectional view of a semiconductor processing system having an upper shield.

Embodiments of the disclosure generally provide a process kit for use in a physical deposition chamber (PVD) chamber. In one embodiment, the process kit provides a chamber component that is configured to substantially prevent complete coating by a deposited material when in use. In one embodiment, the chamber component is an anode that maintains a robust electrical return path for a plasma. The chamber component may be part of a process kit that includes a pre-conditioned or pre-coated anode. The pre-coated anode eliminates process drift which contributes to greater process uniformity and repeatability along with longer chamber component, i.e., process kit, service life. The pre-coated anode also saves money as expensive target material is not utilized to coat the component.

Directional surface shapes or textures may be disposed on the interior surface of a chamber anode, such as the upper shield, which create shadowed areas. Shadowed areas are defined as areas of the feature that are shielded from straight line exposure to a target positioned vertically above the anode. The shadowed areas in the surface shapes are substantially blocked from deposition materials accumulating therein. The shadowed areas prevent deposited material from insulating and isolating the chamber anode and interrupting the electrical ground path for the plasma. The surface shapes can be machined into the part surfaces, i.e., the anode, etched through mechanical or chemical erosion, formed by laser or electron beam surface modification, 3D printing, or formed by other suitable techniques. Since deposition does not occur or the deposition is sufficiently thin in the shadowed areas a direct current (DC) and/or a radio frequency (RF) return path is maintained through many deposition cycles, thus providing process stability and extending the service life of the chamber components, such as the process kit.

In some conventional deposition chambers, a dielectric layer is deposited onto chamber walls (which serve as a ground path for plasma) from a target. This errant deposition changes the properties of the plasma which causes a process drift for a period of time. Drift in plasma properties, primarily voltage, negatively affects the deposited film on the substrate and therefore the quality and performance of the devices formed on the substrate. Additionally, when the plasma voltage rises sufficiently, the plasma will discharge through arcing which will either create a hole through the dielectric material deposited on the process kit or the substrate, causing contamination and/or damage to the substrate. If the plasma does not arc in the upper portion of the chamber, the arc can occur under the substrate support or pedestal in the lower portion of the chamber area bleeding off and destabilizing the plasma, again negatively affecting the deposited film quality.

In one embodiment, the directional surface shape or feature in a chamber component may be in the form of a surface modification. In addition, the surface modification is pre-coated with a dielectric material on specific portions thereof prior to installation into the chamber. Other portions of the surface modification are not pre-coated in order to maintain a metallic surface area or volume that may be used to couple with a plasma. The surface modification has an area or volume that is not in the line-of-sight of atoms that are dislodged from the target material. These areas or volumes protect metallic surfaces from deposition which maintains a viable ground return path for the plasma. Where sufficient depth of the deposit film blocks most of the entrances to the surface modifications, the ground return remains viable due to the shadowed areas remaining substantially free from the deposited films.

The chamber component is pre-coated on select portions thereof in order to provide stable plasma properties in the chamber. As used herein, pre-coated means coated as a chamber component manufacturing step completed prior to installation in a processing chamber in which semiconductor substrates are processed. Pre-coated, as used herein, excludes films deposited on the chamber components in-situ in a processing chamber in which semiconductor substrates are processed. The pre-coated chamber component film thickness on the process kit may be monitored to prevent particle shedding. Thus, the surface modifications, and in particular, the shadow areas, yield a longer kit life for dielectric film deposition while enabling enhanced stability of the plasma and reducing, or eliminating, the potential for dielectric film related arcing.

FIG. 1 depicts an exemplary semiconductor processing chamber 100 having an upper shield 102. The upper shield 102 may be part of a process kit 104. The process kit 104 may also include a cover ring 106, an isolator ring 108, and/or a lower shield 110. The process kit 104, or a portion thereof such as the upper shield 102, may act as a chamber anode 112 for providing a RF return path during plasma processing operations.

The processing chamber 100 may be a sputtering chamber, i.e., a physical vapor deposition (PVD) chamber, capable of depositing a film on a substrate 114. For example, the processing chamber 100 may deposit dielectric materials on the substrate 114, such as silicon oxide ($SiO_2$). It is contemplated that other deposition chambers may also be adapted to benefit from the disclosure.

The processing chamber 100 includes a chamber body 116 having sidewalls 118, a bottom wall 120, and a lid assembly 122 that encloses an interior volume 124. The chamber body 116 may be formed from stainless steel, aluminum or other suitable materials. The sidewalls 118 generally contain a slit valve (not shown) to provide for entry and egress of the substrate 114 to and from the processing chamber 100. The lid assembly 122, in cooperation with the upper shield 102, confines a plasma 126 formed in the interior volume 124 to a region above the substrate 114.

The processing chamber 100 is controlled by a controller 128 that comprises program code having instruction sets configured to control the operation of the processing chamber 100 for processing the substrates 114. For example, the controller 128 can comprise program code that includes an instruction set run a PVC process in the processing chamber 100 to deposit a layer of material on the substrate 114.

A pedestal assembly 130 is disposed in the interior volume 124 of the processing chamber 100. The pedestal assembly 130 supports a deposition ring 132 along with the substrate 114 during processing. The pedestal assembly 130 may be supported from the bottom wall 120 or sidewall 118 of the processing chamber 100. In one embodiment, the pedestal assembly 130 is coupled to the bottom wall 120 of the processing chamber 100 by a lift mechanism 134 that is configured to move the pedestal assembly 130 between upper and lower positions.

The pedestal assembly 130 generally includes a substrate support 136 sealingly coupled to a platform housing 138. The platform housing 138 may be fabricated from a metallic material such as stainless steel or aluminum. A cooling plate (not shown) may be disposed within the platform housing 138 to thermally regulate the substrate support 136. The substrate support 136 may be comprised of aluminum alloy, ceramic or other suitable materials. The substrate support 136 has a substrate receiving surface 140 that receives and supports the substrate 114 during processing. The substrate support 136 also has a peripheral edge 142 that terminates before an overhanging edge of the substrate 114. The substrate support 136 may be an electrostatic chuck, a ceramic body, a heater or a combination thereof. In one embodiment, the substrate support 136 is an electrostatic chuck that includes a dielectric body having a conductive layer embedded therein.

The lid assembly 122 generally includes a lid 144, a sputtering target 146, and a magnetron 148. The lid 144 is supported by the sidewalls 118. The sputtering target 146 is coupled to the lid 144 and exposed to the interior volume 124 of the processing chamber 100. The sputtering target 146 has a sputtering surface 150. The sputtering target 146, and in particular the sputtering surface 150, provides material which is deposited on the substrate 114 during processing. The isolator ring 108 is disposed between the sputtering target 146, lid 144, and chamber body 116 to electrically isolate the sputtering target 146 from the lid 144 and the chamber body 116. The sputtering target 146 is biased by a power source 152 relative to a common ground 154, 156 coupled to the processing chamber 100.

A process gas is supplied to the interior volume 124 from a gas source 158 via conduits 160. The gas source 158 may comprise a non-reactive gas such as argon or xenon, which is capable of energetically impinging upon and sputtering material from the sputtering surface 150 of the sputtering target 146. The gas source 158 may additionally comprise a reactive gas such as oxygen, nitrogen, hydrogen or other suitable gas for reacting with material sputtered from the sputtering target 146. Spent process gas and byproducts are exhausted from the processing chamber 100 through an exhaust port 162. The exhaust port 162 is fluidly attached to an exhaust conduit 164. The exhaust conduit 164 is connected to an exhaust pump 166. The exhaust conduit 164 may have a throttle valve to control the atmospheric pressure of the interior volume 124 in the processing chamber 100.

The magnetron 148 is coupled to the lid 144 on the exterior of the processing chamber 100. The magnetron 148 is electrically coupled to the power source 152. Electrical energy from the magnetron 148 energizes the gas to form ions and maintain the plasma 126 in the interior volume 124 of the processing chamber 100. The plasma 126 is formed between the substrate 114 and the sputtering target 146. The gas ions are accelerated toward the sputtering target 146 and cause material to become dislodged from the sputtering surface 150. The dislodged material from the sputtering surface 150 is deposited on the substrate 114.

The upper shield 102, and in some embodiments the lower shield 110, encircles the sputtering surface 150 of the sputtering target 146 and the peripheral edge 142 of the substrate support 136. The upper shield 102 and lower shield 110 cover the sidewalls 118 of the processing chamber 100 to reduce deposition of sputtering deposits originating from the sputtering surface 150 of the sputtering target 146 onto the sidewalls 118 and surfaces behind the upper and lower shield 102, 110. For example, the upper shield 102, in conjunction with the lower shield 110, can protect the surfaces of the substrate support 136, the overhanging edge of the substrate 114, sidewalls 118 and bottom wall 120 of the processing chamber 100. The upper shield 102 may be of unitary construction with the lower shield 110. Alternately, the upper shield 102 and lower shield 110 may be formed separately.

The upper shield 102 may comprise a cylindrical outer band 168 having a top 170 and a bottom 172. The cylindrical outer band 168 has a diameter dimensioned to encircle the sputtering surface 150 of the sputtering target 146 at the top 170 and the substrate support 136 at the bottom 172. The upper shield 102 may have exposed surfaces, for example an interior surface 174, facing the interior volume 124 in the processing chamber 100. In one embodiment, the interior surface 174 may be grit blasted to have a surface roughness such as between about 175 microinches to about 450 microinches. The surface roughness serves to promote film adhesion, i.e., reduce particle shedding, and prevent contamination within the interior volume 124 of the processing chamber 100.

The upper and lower shields 102, 110 may be electrically bonded to the processing chamber 100, i.e., ground 154, and form the chamber anode 112 for the ground return path for the plasma 126 formed in the interior volume 124. Each of the upper and lower shields 102, 110 comprise an electrically conductive body made of a metallic material, such as aluminum or stainless steel. The upper shield 102 includes a pre-coated film 176 provided on portions thereof. The film 176 on portions of the upper shield 102 reduces or eliminates process drift in the processing chamber 100. The film 176 also saves money as expensive target material is not utilized to coat the upper shield 102. The film 176 is applied to the upper shield 102 prior to installation thereof into the processing chamber 100. The film 176 disposed on the upper shield 102 prevents electrically insulating the chamber anode 112 and negatively affecting the plasma 126 causing process drift and/or arcing.

In some embodiments, the interior surface 174 is coated with a layer of aluminum using an arc-spray technique, such as twin wire arc spray (TWAS) methods, on top of the grit blasted surface. The layer of arc-sprayed aluminum is utilized to improve process kit life and adhesion of the film 176. The layer of arc-sprayed aluminum may also be utilized to produce a sacrificial layer under the film 176. The layer of arc-sprayed aluminum may also assist in recycling. For example, when the upper and lower shields 102, 110 need to be refurbished, the layer of arc-sprayed aluminum that has been coated with the film 176 may be chemically or electrochemically dissolved to expose the conductive base material. Thereafter, the upper and lower shields 102, 110 may be recoated with the coating 176 for additional processing.

Figure 2:
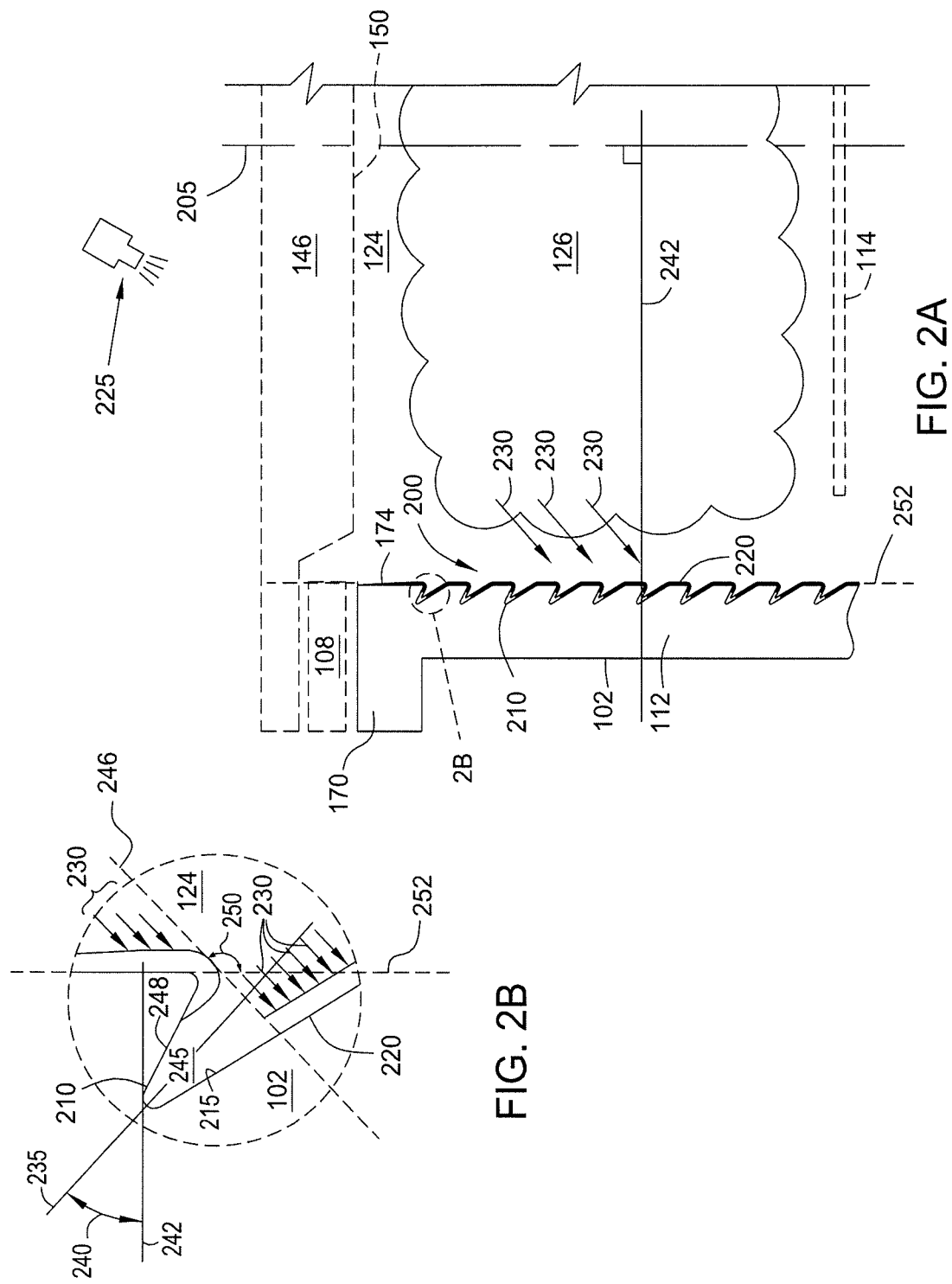
FIG. 2A is a partial sectional view of the upper shield having one embodiment of a textured surface.
FIG. 2B is an enlarged view of a portion of the upper shield of FIG. 2A.

FIG. 2A is a partial sectional view of the upper shield 102 having one embodiment of a textured surface 200. FIG. 2B is an enlarged view of a portion of the upper shield 102 of FIG. 2A. In FIG. 2A, the target 146, the isolator ring 108, and the substrate 114 are shown in dashed lines to show relative positions of the upper shield 102 to the sputtering surface 150 of the target 146. FIGS. 2A and 2B are exemplary depictions of one embodiment of a pre-coating process for pre-conditioning the upper shield 102.

The textured surface 200 may be integral to the interior surface 174 of the upper shield 102, or process kit 118. It should be appreciated that the textured surface 200 may be applied to additional chamber components, such as the lower shield 110, to achieve an ultimate result for performance of the RF ground path. However, the following discussion will be in reference primarily to the upper shield 102 for the sake of simplicity. The textured surface 200 may be formed in or on the interior surface 174 by any suitable manner. For example, the textured surface 200 may be formed by imprinting, machining, burning therein, depositing thereon, adhering thereto, 3D printing or by other suitable techniques. The upper shield 102 has a vertical centerline 205. The vertical centerline 205 is additionally perpendicular to the sputtering surface 150 of the target 146.

Figure 3:
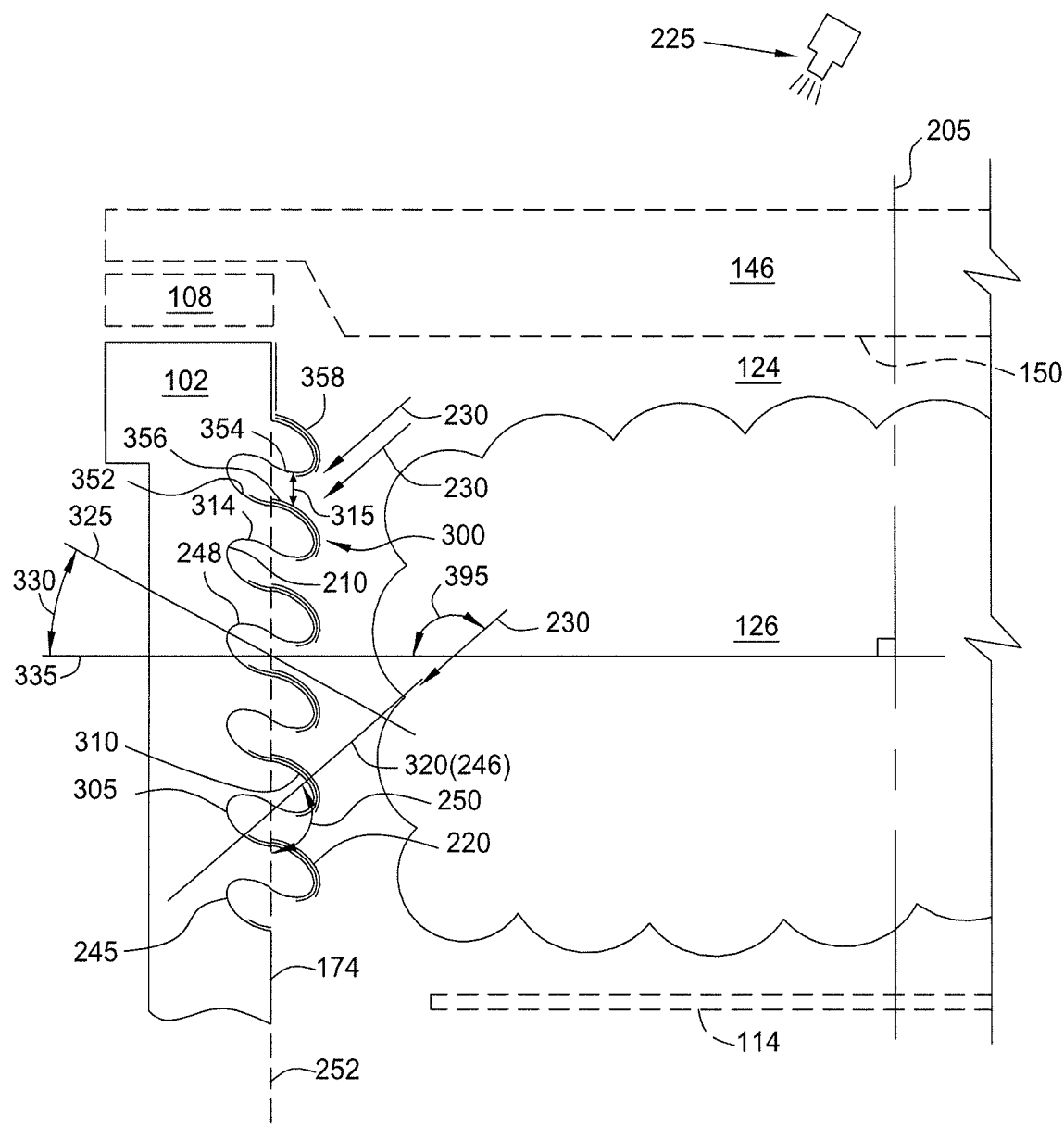
FIG. 3 is a partial sectional view of the upper shield having another embodiment of a textured surface.

The textured surface 200 includes a plurality of features 210. The features 210 of the textured surface 200 may extend into the interior surface 174 away from the interior volume 124. For example, the textured surface 200 may include an inner surface 215. Alternatively, the features 210 of the textured surface 200 may protrude from the interior surface 174 into the interior volume 124. In yet other embodiments, the features 210 may both extend into the interior surface 174 and protrude therefrom, such as illustrated in FIG. 3. In one or more embodiments, the features 210 may have a density in the textured surface 200 of between 30 per $cm^2$ and about 60 per $cm^2$, such as about 42 per $cm^2$. The features 210 in this example can also be circumferential (e.g., grooves cut around the shield) to the upper shield 102 with a feature size such that they have a vertical density of features in between 2 per cm and 10 per cm.

In order to pre-condition the upper shield 102, a deposition process may be performed to form a pre-coated film 220 on portions of the features 210. The film 220 is the same as the film 176 shown and described in FIG. 1. In one example, a deposition or spray technique may be utilized to form the film 220 on the interior surface 174 of the upper shield 102, i.e., the chamber anode 112. The film 220 is a dielectric material, such as silicon oxide ($SiO_2$), aluminum nitride (AlN) or zirconium (Zr). A plasma spray method may be utilized to form the film 220. The film 220 has a porosity of about 2% to about 3.5%. The porosity of the film 220 is greater than a porosity of a film or layer that may be sputtered onto the upper shield 102. For example, a film or layer that is formed by material deposited from the sputtering target 146 is not porous (e.g., about 0.0% porosity).

In the embodiment shown in FIGS. 2A and 2B, a nozzle 225 is positioned at an angle to provide particulate 230 that adheres to specific portions of the features 210 as well as other portions of the interior surface 174 of the upper shield 102 as the film 220.

Particulate 230 from the nozzle 225 has a downward trajectory as illustrated by the arrows. The film 220 may form on portions of the textured surface 200. A profile of the feature 210 may have a geometric centerline 235, as shown in FIG. 2B, which is at an angle 240 from an imaginary line 242 that extends perpendicular from the vertical centerline 205 of the upper shield 102. The imaginary line 242 is in a plane that is generally parallel to a horizontal line and/or orthogonal to a plane of the vertical centerline 205 of the upper shield 102. The angle 240 is generally an acute angle that is greater than 0 degrees, such as greater than 10 degrees, such as between about 20 degrees and about 70 degrees. The feature 210 has blind openings shown as shaded areas 245 which are blocked from a trajectory plane 246 of the particulate 230 based on the position of the nozzle 225. The shaded areas 245 are protected (i.e., remain free) from particulate 230 by an overhanging portion of the shield 102. The trajectory plane 246 is achieved by positioning the nozzle 225 to spray the particulate 230 at a spray angle 250 measured from a plane 252 of the textured surface 200. The plane 252 is parallel to the vertical centerline 205 of the upper shield 102. In one embodiment, the spray angle 250 is greater than 90 degrees and less than 180 degrees, such as between about 110 degrees and about 160 degrees as measured from the plane 252 of the textured surface 200. In another embodiment, the spray angle 250 is about 10 degrees and about 45 degrees as measured from the plane 252 of the textured surface 200.

The angle 250 will still shadow the great majority of the deposition from entering in the feature 210 while the greater the angle 250 will enhance the effectiveness of the shadowing. Generally, the larger or closer the angle 250 is to 90 degrees, the larger the shaded areas 245 will be.

For example, the shaded areas 245 disposed in the inner surface 215 of the feature 210 (shown left of the trajectory line 246) are not visible, i.e., no straight line exposure, to the particulate 230 from the nozzle 225, and thus no film 220 will be formed thereon or therein. The angle 240 of the feature 210 may be maintained at or near 90 degrees to the trajectory 246 of the particulate 230. Thus, particulate 230 may form films on portions of the inner surface 215. However, the particulate 230 do not appreciably accumulate on the shaded areas 245 as opposed to the portion of the inner surface 215 having straight line exposure to the nozzle 225. Once the desired surfaces of the features 210 are sufficiently coated with the film 220, such as a film 220 of about 0.1 millimeters to about 0.4 millimeters, or greater, the upper shield 102 may be installed in the processing chamber 100 of FIG. 1 and utilized for processing substrates. A large angle 250 of the nozzle 225 ensures that a large portion of the feature 210 is defined by the shaded areas 245, and thus available to function as an anode after many deposition cycles as described below.

The shaded area 245 of the feature 210 has an anode surface area 248 (i.e., a "film free" or uncoated surface) that remains substantially free of the film 220 due to the downward facing orientation of the feature 210. Each feature 210 has a respective anode surface area 248 that is free of film 220. In a first embodiment, the anode surface area 248 in each feature 210 is about 0.0005 square centimeters ($cm^2$). This area calculation is represented in the embodiment of FIG. 3. In a second embodiment as shown in FIG. 2B, the anode surface area 248 in each feature 210 is about 10 $cm^2$. Assuming about a 10 $cm^2$ vertical area on the upper shield 102 and a feature size of about 3 millimeter shadowing a 1 millimeter ring, the second embodiment of the surface area 248 yields about 300 $cm^2$ of shadowed surface area. The number and pattern of features 210 in the textured surface 200 may be determined to provide a sufficiently quantity of the anode surface area 248 to maintain a suitable electrical pathway for the RF return path. For example, the plasma processing performance in the processing chamber 100 configured for a 200 millimeter substrate is enhanced by maintaining a film free surface area (area 248) for the anode of at least about 15 $cm^2$, such as between about 15 $cm^2$ and about 70 $cm^2$ (Shown in the embodiment of FIG. 3). In another example, the plasma processing performance in the processing chamber 100 configured for a 300 mm substrate is enhanced by maintaining a film free surface area (area 248) for the anode of at least about 300 $cm^2$, such as between about 300 $cm^2$ and about 600 $cm^2$. In one embodiment, the total anode surface area 248 in all the features 210 in the processing chamber 100 is about 32 $cm^2$. Thus, the anode surface area 248 provides an enhanced ground path for the plasma 126 even after any additional film from the sputtering target 146 builds up on and insulates outer portions of the anode 112. The pre-coating of the upper shield 102 not only minimizes chamber burn-in time but also helps maintain process stability for quality substrate processing. The enhanced ground provided by the anode surface area 248 prevents arcing, thus preventing the contamination of the substrate 114, along with preventing equipment damage. Thus, the downward facing orientation of the feature 210 ensures that a significant portion of the shaded areas 245 remain deposition free and functions efficiently as an anode, which extends the service life of the film coated chamber equipment.

The features 210 may be circumferential grooves or depressions. The shaded area 245 in the circumferential grooves or depressions may be about 1 millimeter wide when taken at a cross-section such as that illustrated in FIG. 2A. A dozen or more of the features 210 (circumferential grooves or depressions) may be formed in the upper shield 102. Thus, the anode surface area 248 in the upper shield 102 may be increased to yield an area of about 132 cm$^2$ or more surface area free of the dielectric film 220.

FIG. 3 is a partial sectional view of the upper shield 102 having another embodiment of a textured surface 300. In FIG. 3, the target 146, the isolator ring 108, and the substrate 114 are shown in dashed lines to show relative positions of the upper shield 102 to the sputtering surface 150 of the target 146. FIG. 3 is an exemplary depiction of another embodiment of a pre-coating process for pre-conditioning the upper shield 102.

The textured surface 300 has features 210 forming an indentation 305 which extends into the interior surface 174. The textured surface 300 additionally has features 210 forming a protrusion 310 extending inward of from the interior surface 174. The indentations 305 and protrusions 310 may be form in a repeating pattern or array. The indentations 305 and protrusions 310 may have be circular, rectangular or have any other suitable shape. Each of the indentations 305 have an opening 315. The opening 315 exposes the indentation 305 to the interior volume 124 of the processing chamber 100. The indentations 305 and protrusions 310 may additionally be a mix of shapes arranged in a manner which maximized the shaded area 245. For example, each indentation 305 may have one protrusion 310 adjacent thereto. In one embodiment, a respective one of the protrusions 310 is positioned above each indentation 305. In another embodiment, each indentation 305 is bounded by protrusions 310 such that no indentation 305 is adjacent another indentation 305. In these and other similar arrangements, the protrusions 310 may limit the line of sight to the nozzle 225, shown by line 320, further away from the opening 315 of the indentation 305 and thus increase the size of the shaded area 245 of each indentation 305.

Line 320 is also the trajectory plane 246 of the nozzle 225. In one embodiment, the trajectory plane 246 is provided to mimic the angle(s) of particulate that is dislodged from the sputtering target 146 when the processing chamber 100 is in use. The spray angle 250 measured from the plane 252 of the textured surface 200, which is generally orthogonal to the sputtering surface 150 of the sputtering target 146. For example, in one embodiment, the spray angle 250 is greater than 90 degrees and less than 180 degrees, such as between about 110 degrees and about 160 degrees as measured from the plane 252 of the textured surface 200. In another embodiment, the spray angle 250 is about 10 degrees and about 45 degrees as measured from the plane 252 of the textured surface 200.

Thus, the upper shield 102 may be pre-coated with the dielectric film 220 from the nozzle 225. The anode surface area 248 provides an enhanced ground path for the plasma 126 even after any additional film from the sputtering target 146 builds up on and insulates outer portions of the anode 112. The pre-coating of the upper shield 102 not only minimizes chamber burn-in time but also helps maintain process stability for quality substrate processing. The enhanced ground provided by the anode surface area 248 prevents arcing, thus preventing the contamination of the substrate 114, along with preventing equipment damage. Therefore, the downward facing orientation of the feature 210 ensures that a significant portion of the shaded areas 245 remain deposition free and functions efficiently as an anode, which extends the service life of the film coated chamber equipment.

The profile of the indentations 305 as shown in FIG. 3 has a centerline 325 extending therethrough. The centerline 325 forms an angle 330 to an imaginary line 335 extending perpendicular from the vertical centerline 205 of the upper shield 102. The features 210 have shaded areas 245 disposed in the indentations 305 where the any film deposition is prevented from forming when the film 220 from the nozzle 225 is applied.

During processing of a substrate in the processing chamber 100 (FIG. 1), the pre-coated film 220 may have a thicker area 358 in areas directly exposed to particulate from the sputtering target 146. The pre-coated film 220 may additionally have areas of lesser thickness area 352 which may still provide a conductive pathway for grounding the plasma 126. There may be other areas of the pre-coated film 220 having a thickness area 356 somewhere between the lesser thickness area 352 and thicker area 358 which provide diminished ground return path conductivity.

A film free anode area 314 is present in the shaded areas 245. The arrangements and size of the indentations 305 and protrusions 310 may be configured to maximize the surface area of the anode area 314. The total area of the anode area 314 and the minimum thickness area 352 in each feature 210 of the textured surface 300 in the processing chamber 100 configured for a 200 mm substrate may be at least about 15 cm$^2$, such as between about 15 cm$^2$ and about 70 cm$^2$. Alternately, in the processing chamber 100 configured for a 300 mm substrate, the total area of the anode area 314 and the minimum thickness area 352 in each feature 210 of the textured surface 300 is at least about 30 cm$^2$, such as between about 30 cm$^2$ and about 210 cm$^2$. Thus, the arrangement of both indentations 305 and protrusions 310 at an angle, such as angle 330, may provide a better ground for controlling the plasma 126.

Figure 4:
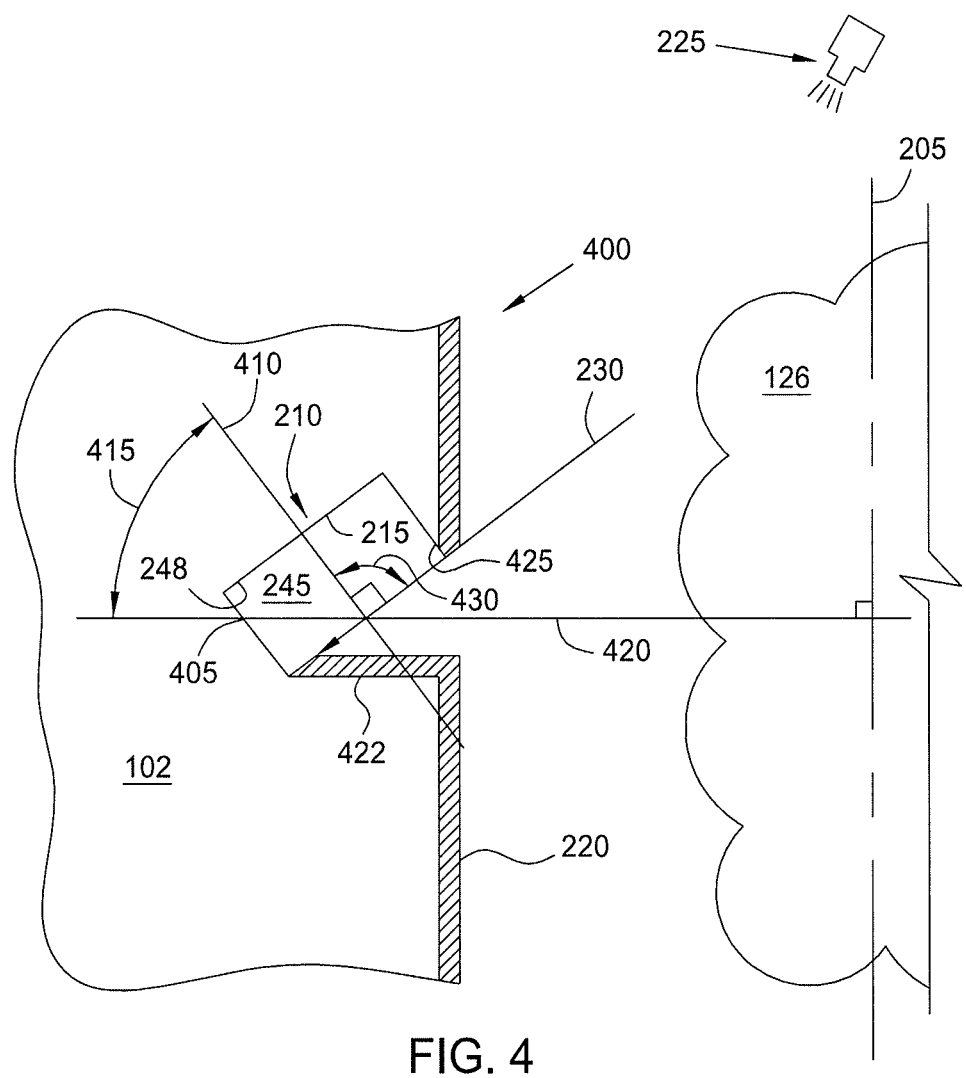
FIG. 4 is a partial sectional view of other embodiments of a textured surface.

FIG. 4 is a partial sectional view of other embodiments of a textured surface 400 having a feature 210. The feature 210 has a shape 405 which may be configured to maximize the shaded area 245. The shape 405 is shown to be rectangular but may be any shape. For example, the shape 405 of the feature 210 may be circular, hexagonal, oblong, irregular or any suitable form. The shape 405 of the feature 210 may be selected to increase or decrease the anode surface area 248 in the shaded area 245. A centerline 410 may form an angle 415 to an imaginary line 420 extending perpendicular from the vertical centerline 205 of the upper shield 102. The centerline 410 of the feature 210 may be configured at an angle 430 to the particulate 230 such that the particulate 230 are minimized from entering therein. The angle 430 may be greater than zero degrees, such as greater than 10 degrees, such as between 20 degrees and 70 degrees. The rotation of the feature 210 (i.e., centerline 410) between about 20 degrees and about 70 degrees from the imaginary line 420 may result in the angle 430 between the centerline 410 of the feature 210 and the line of sight with the nozzle 225 and/or the sputtering target 146 (not shown) as indicated by particulate 230, is 30 degrees or more, such as 90 degrees. An overhang, similar to the protrusion 310 in FIG. 3, may extend downward from an upper portion 425 of the shape 405 to increase the area not having straight line exposure to the nozzle 225 and/or the sputtering target 146. The larger the overhang, the larger the shaded area 245, thus, increasing the anode surface area 248. The total amount of the anode surface area 248 can therefore be selected for a predetermined ground path of the electrical circuitry. It should be appreciated that the area void of the pre-coated film 220 aids in providing the grounding which controls the plasma properties and overall substrate quality.

Figure 5:
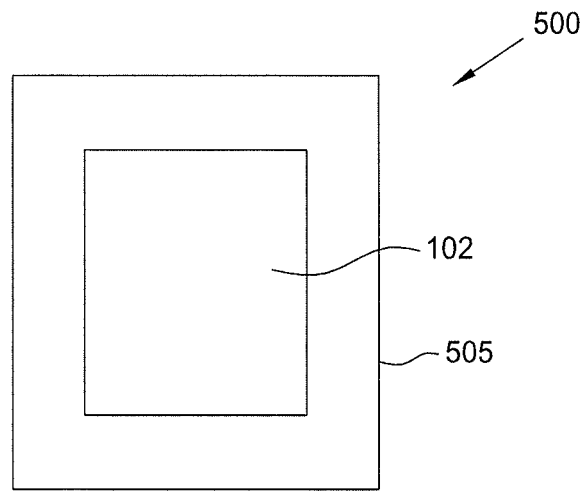
FIG. 5 is a schematic depiction of a packaged chamber component.

FIG. 5 is a schematic depiction of a packaged chamber component 500. The packaged chamber component 500 includes the upper shield 102 as described herein within a clean room bag 505. For example, after formation of the pre-coated film 220 onto the upper shield 102 on the respective textured surfaces as described above, the upper shield 102 is placed into the clean room bag 505 and sealed.

The components of the process kit 118, having the textured surface 200 as well as the pre-coated film 220 pre-formed thereon as described above, work alone or in combination to significantly reduce particle generation and stray plasmas. The RF return path, i.e., ground path, contributing to RF harmonics causing stray plasma outside the process cavity, is improved by the surface texture on the anode. Thus, when dielectric films are deposited in PVD chambers, the buildup of a dielectric layer on the process kit does not impact the anode. The surface texture prevents process drift relative to an uncoated kit. Additionally, the surface texture prevents voltage discharge through arcing which will either blow a hole through the deposition somewhere on the process kit or wafer causing particles and/or wafer damage.

While the foregoing is directed to embodiments of the present disclosure, other and further embodiments of the disclosure may be devised without departing from the basic scope thereof, and the scope thereof is determined by the claims that follow.

What is claim is:

1. A process kit for a plasma processing chamber, comprising:
   a conductive body having an orientation when the body is in use in the processing chamber that defines a top of the body and a vertical centerline, the body having:
      a textured surface formed by an array of features formed in a surface of the body that is exposed to a plasma when in use in the processing chamber, the features having an opening in the surface;
      the features having a profile, the profile having a geometric centerline extending away from the top of the body through the opening, the geometric centerline forming an acute angle with the vertical centerline of the body; and
      a film applied to the features on portions of the features at a spray angle of between about 110 degrees and about 160 degrees as measured from a plane of the textured surface, the spray angle protecting a shaded area of the features that includes areas of the body that function as an anode when in use in the processing chamber, wherein the film includes a porosity of about 2% to about 3.5%.

2. The process kit of claim 1, wherein the features further comprise:
   an overhanging portion defined on a side of the opening closest the top of the body, wherein a greater portion of the profile resides above an imaginary line extending perpendicularly through the vertical centerline and intersecting a tip of the overhanging portion.

3. The process kit of claim 1, wherein the surface of the body includes a sacrificial coating.

4. The process kit of claim 1, wherein the film is comprised of a dielectric material.

5. The process kit of claim 1, wherein the conductive body is configured as a cylindrical shield.

6. The process kit of claim 1, wherein a cross section of the conductive body has a sawtooth shape defined by the features, or the cross section of the conductive body has a wave shape defined by the features.

7. The process kit of claim 1, wherein the surface of the body under the film has a grit blasted texture.

8. The process kit of claim 7, wherein the grit blasted texture has a surface roughness between about 175 microinches to about 450 microinches.

9. The process kit of claim 1, wherein the profiles of the surface features have a combined area of at least about 15 square centimeters and are formed at an angle to a plane perpendicular to the vertical centerline.

10. A process kit for a RF physical vapor deposition (RFPVD) chamber, comprising:
    a conductive body having an orientation when the process kit is in use in the RFPVD chamber that defines a top of the body and a vertical centerline, the body having:
       a textured surface formed by an array of features formed in a substantially vertical surface of the body that is exposed to a plasma when the process kit in use in the RFPVD chamber, the features having an opening in the surface;
       the features having a profile, wherein a greater portion of the profile resides above an imaginary line extending perpendicularly through the vertical centerline and an edge of the opening closest the top of the body; and
       a spray film applied to the features on portions of the features at a spray angle of between about 110 degrees and about 160 degrees as measured from a plane of the textured surface, the plane being substantially parallel to the vertical centerline, wherein a shaded area of the features, comprising areas of the body that function as an anode when in use in the RFPVD chamber, is shielded from the spray film by the spray angle, wherein the spray film includes a porosity of about 2% to about 3.5%.

11. The process kit of claim 10, wherein the profile of the features further comprise:
    a geometric centerline extending away from the top of the body through the opening, the geometric centerline forming an acute angle with the vertical centerline of the body, the features having a shadowed area having a configuration that prevents straight line exposure to a sputtering target when the process kit in use in the RFPVD chamber.

12. The process kit of claim 10, wherein the surface of the body includes a sacrificial coating.

13. The process kit of claim 10, wherein the spray film is comprised of a dielectric material.

14. The process kit of claim 10, wherein the conductive body is configured as a cylindrical shield, the vertical surface defining an inner cylindrical sidewall of the body.

15. The process kit of claim 10, wherein the surface of the body is textured.

16. The process kit of claim 10, wherein the surface of the body under the spray film has a grit blasted texture.

17. The process kit of claim 16, wherein the grit blasted texture has a surface roughness between about 175 microinches to about 450 microinches.

18. The process kit of claim 10, wherein the profiles of the surface features have a combined area of at least about 15 square centimeters and are formed at an angle to a plane perpendicular to the vertical centerline.

19. A physical vapor deposition (PVD) chamber, comprising:
    a chamber body defining in interior volume;
    a substrate support disposed in the interior volume;
    a sputtering target disposed in the interior volume above the substrate support; and a process kit disposed in the interior volume between the substrate support and sputtering target, the process kit comprising:
  a conductive body having a vertical centerline, the body having an array of features formed in a surface of the body that is exposed to a plasma when in use in the PVD chamber, the surface having a sacrificial coating disposed thereon, the features having an opening in the surface, the features having a profile, the profile having a geometric centerline extending away from the target through the opening, the geometric centerline forming an acute angle with the vertical centerline of the body, and a spray film is formed on a portion of the sacrificial coating on a portion of the features, wherein the spray film includes a porosity of about 2% to about 3.5%.

20. The PVD chamber of claim 19, wherein the profile of features has a greater portion that resides above an imaginary line extending perpendicularly through the vertical centerline and an edge of the opening closest the top of the body.

* * * * *